(12) United States Patent
Wang (10) Patent No.: US 10,416,515 B2
(45) Date of Patent: Sep. 17, 2019

(54) PIXEL UNIT, ARRAY SUBSTRATE, AND DISPLAY DEVICE, AND FABRICATION METHODS THEREOF

(71) Applicant: BOE TECHNOLOGY GROUP CO., LTD., Beijing (CN)

(72) Inventor: Zuqiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 42 days.

(21) Appl. No.: 15/567,207

(22) PCT Filed: Apr. 25, 2017

(86) PCT No.: PCT/CN2017/081874
§ 371 (c)(1),
(2) Date: Oct. 17, 2017

(87) PCT Pub. No.: WO2017/198048
PCT Pub. Date: Nov. 23, 2017

(65) Prior Publication Data
US 2018/0217464 A1   Aug. 2, 2018

(30) Foreign Application Priority Data
May 16, 2016   (CN) .......................... 2016 1 0323593

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/1368* (2013.01); *G02F 1/133345* (2013.01);
(Continued)

(58) Field of Classification Search
CPC ......... G02F 1/136286; G02F 1/133345; G02F 1/1368; G02F 2201/123;
(Continued)

(56) References Cited

U.S. PATENT DOCUMENTS

2006/0006540 A1* 1/2006 Park .................... H01L 27/3248
257/758
2006/0125390 A1   6/2006 Oh
(Continued)

FOREIGN PATENT DOCUMENTS

CN         1949511 A       4/2007
CN         101110430 A     1/2008
(Continued)

OTHER PUBLICATIONS

International Search Report & Written Opinion dated Aug. 2, 2017, regarding PCT/CN2017/081874.
(Continued)

*Primary Examiner* — Jonathan A Boyd
(74) *Attorney, Agent, or Firm* — Intellectual Valley Law, P.C.

(57) ABSTRACT

Pixel unit, array substrate, and display device, and their fabrication methods are provided. The disclosed pixel unit can include: a transistor, including a drain electrode; a pixel electrode, including a first bottom conductive layer in contact with a surface of the drain electrode and a metal layer; and a planarization layer, formed on the transistor and the first bottom conductive layer. The metal layer is electrically connected to the first bottom conductive layer through a via-hole in the planarization layer.

20 Claims, 4 Drawing Sheets

(51) Int. Cl.
*G02F 1/1333* (2006.01)
*G02F 1/1368* (2006.01)

(52) U.S. Cl.
CPC ........ *H01L 27/124* (2013.01); *H01L 27/1248* (2013.01); *G02F 2001/133357* (2013.01); *G02F 2201/123* (2013.01)

(58) Field of Classification Search
CPC ..... G02F 2001/133357; H01L 27/1248; H01L 27/124
See application file for complete search history.

(56) References Cited

U.S. PATENT DOCUMENTS

| | | |
|---|---|---|
| 2007/0139571 A1 | 6/2007 | Kimura |
| 2007/0194677 A1 | 8/2007 | Liu et al. |
| 2008/0017859 A1 | 1/2008 | Tai et al. |
| 2012/0300162 A1* | 11/2012 | Uchino ............ G02F 1/133788 349/123 |
| 2013/0001533 A1 | 1/2013 | Kim et al. |
| 2014/0166349 A1 | 6/2014 | Otsuka et al. |
| 2015/0129883 A1* | 5/2015 | Kimura ............ G02F 1/133707 257/72 |

FOREIGN PATENT DOCUMENTS

| | | |
|---|---|---|
| CN | 101640218 A | 2/2010 |
| CN | 103889144 A | 6/2014 |
| JP | 6412575 A | 1/1989 |
| JP | 01133366 A | 5/1989 |

OTHER PUBLICATIONS

First Office Action in the Chinese Patent Application No. 201610323593.4, dated Feb. 28, 2018 English translation attached.

* cited by examiner

PIXEL UNIT, ARRAY SUBSTRATE, AND DISPLAY DEVICE, AND FABRICATION METHODS THEREOF

CROSS-REFERENCE TO RELATED APPLICATION

This application is a national stage application under 35 U.S.C. § 371 of International Application No. PCT/CN2017/081874, filed Apr. 25, 2017, which claims the priority of Chinese Patent Application No. 201610323593.4, filed on May 16, 2016, the entire contents of which are incorporated herein by reference.

FIELD OF THE DISCLOSURE

The present disclosure generally relates to the field of display technology and, more particularly, relates to a pixel unit, an array substrate, and a display device, and their fabrication methods.

BACKGROUND

In a conventional array substrate for display devices, a pixel electrode is often electrically connected to a drain electrode of a transistor through a via-hole in a planarization layer. This, however, may include a small contact area, and thus a high contact resistance, between the bottom conductive layer and the drain electrode. Consequently, an effective current produced by the transistor is small, and a power consumed by the entire display device is large.

The disclosed pixel unit, array substrate, and display device, and their fabrication methods are directed to solve one or more problems set forth above and other problems.

BRIEF SUMMARY OF THE DISCLOSURE

In accordance with some embodiments of the present disclosure, a pixel unit, an array substrate, and a display device, and their fabrication methods are provided.

One aspect of present disclosure provides a pixel unit, including: a transistor, including a drain electrode; a pixel electrode, including a first bottom conductive layer in contact with a surface of the drain electrode and a metal layer; and a planarization layer, formed on the transistor and the first bottom conductive layer. The metal layer is electrically connected to the first bottom conductive layer through a via-hole in the planarization layer.

In some embodiments, the first bottom conductive layer covers an entire surface of the drain electrode.

In some embodiments, the first bottom conductive layer further covers one or more sidewalls of the drain electrode.

In some embodiments, the pixel unit further includes a second bottom conductive layer formed on a source electrode of the transistor. The second bottom conductive layer covers an entire surface and one or more sidewalls of the source electrode.

In some embodiments, the second bottom conductive layer further covers data lines connected with the source electrode.

In some embodiments, the pixel unit further includes a third bottom conductive layer formed to cover a gate line connected with the gate electrode of the transistor.

In some embodiments, the metal layer is metallic silver layer.

In some embodiments, the pixel electrode further includes a top conductive layer formed on the metal layer. The top conductive layer covers the metal layer.

Another aspect of the present disclosure provides an array substrate, including: a base substrate; and at least one disclosed pixel unit on the base substrate.

Another aspect of the present disclosure provides a display device including a disclosed array substrate.

Another aspect of the present disclosure provides a method for fabricating a pixel unit, including: forming a transistor including a drain electrode; forming a first bottom conductive layer in contact with a surface of the drain electrode to cover the drain electrode; forming a planarization layer on the transistor and the first bottom conductive layer; forming a via-hole in the planarization layer to expose the first bottom conductive layer; and forming a metal layer on the planarization layer and electrically connected with the first bottom conductive layer through the via-hole.

In some embodiments, the first bottom conductive layer is formed to cover an entire surface and one or more sidewalls of the drain electrode.

In some embodiments, forming the first bottom conductive layer includes: forming a conductive film on the transistor; and patterning the conductive film to form the first bottom conductive layer on the drain electrode.

In some embodiments, the method further includes forming a second bottom conductive layer on a source electrode of the transistor to cover the source electrode.

In some embodiments, the second bottom conductive layer is formed simultaneously with the first bottom conductive layer during a one-stage patterning process.

In some embodiments, the second bottom conductive layer is formed to cover an entire top surface and all sidewalls of the source electrode.

In some embodiments, the second bottom conductive layer is formed to further cover a data line connected with the source electrode.

In some embodiments, the method further includes forming a third bottom conductive layer on a gate line connected with the gate electrode of the transistor to cover the gate line.

In some embodiments, the third bottom conductive layer is formed simultaneously with the first bottom conductive layer during the patterning process.

In some embodiments, the method further includes forming a top conductive layer on the metal layer to cover the metal layer.

Other aspects of the present disclosure can be understood by those skilled in the art in light of the description, the claims, and the drawings of the present disclosure.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings in order to fully understand and being able to implementing the present disclosure and to realizing the technical effect. It should be understood that the following description has been made only by way of example, but not to limit the present disclosure.

Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

Various embodiments, the present disclosure provides a pixel unit, a fabrication method thereof, a related array substrate, and a related display device. For example, array substrates may be used in display devices, such as active matrix liquid crystal display devices, and active matrix organic light-emitting display devices for driving the display screens to display images.

Figure 1:
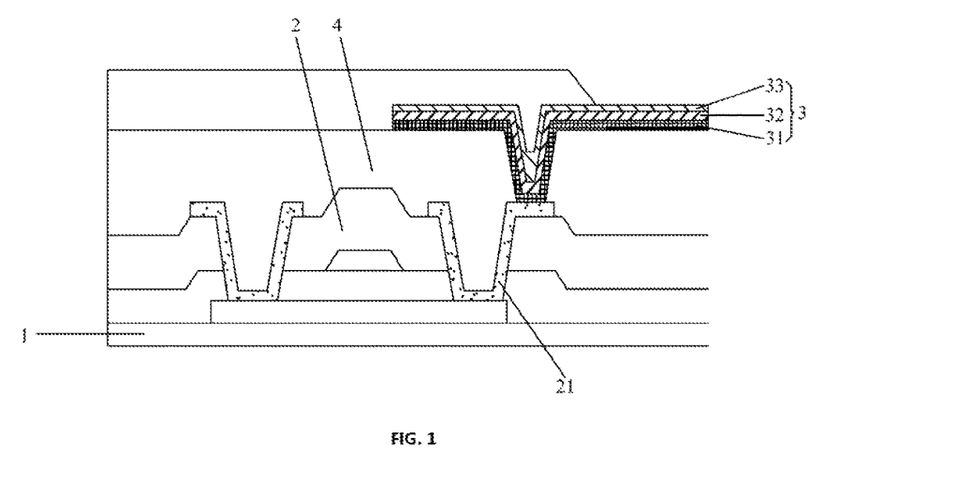
FIG. 1 illustrates a schematic cross sectional structural view of an array substrate.

As illustrated in FIG. 1, an array substrate includes a base substrate 1, and multiple pixel units provided on the base substrate 1. Each pixel unit includes a transistor 2, a pixel electrode 3, and a planarization layer 4 located between the transistor 2 and the pixel electrode 3. The planarization layer 4 has a via-hole. The pixel electrode 3 generally includes three layers stacked in an order of: a bottom, conductive layer 31, a metal layer 32, and a top conductive layer 33. The bottom conductive layer 31 is electrically connected to the drain electrode 21 of the transistor 2 through the via-hole.

However, since the bottom conductive layer 31 and the drain electrode 21 are electrically connected through only one via-hole, the contact area between the bottom conductive layer 31 and the drain electrode 21 is normally small, resulting in a high contact resistance between the pixel electrode 3 and the drain electrode 21. Therefore, an effective current produced by the transistor 2 is small, and a power consumed by the entire display device is large.

Figure 2:
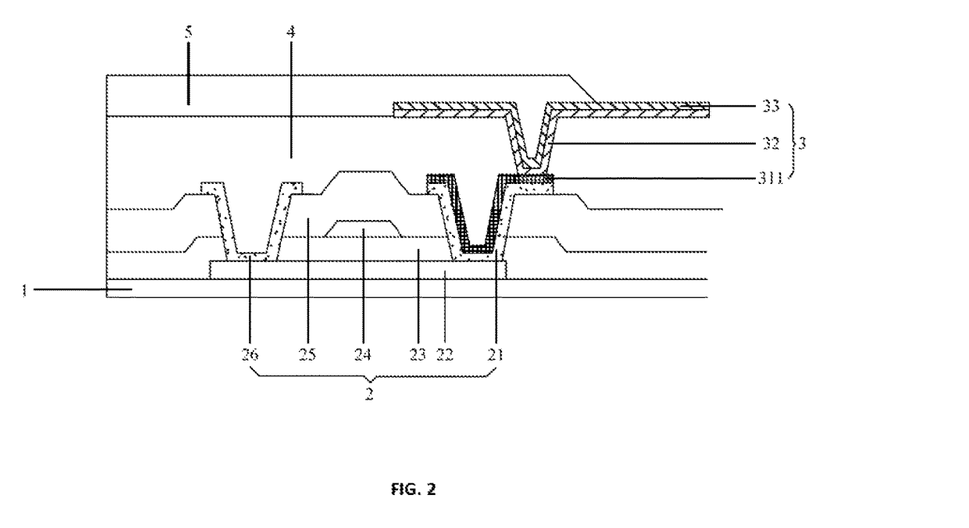
FIG. 2 illustrates a schematic cross sectional structural view of an exemplary pixel unit in accordance with some embodiments of the present disclosure.

FIG. 2 illustrates a schematic cross sectional structural view of an exemplary pixel unit in accordance with some embodiments of the present disclosure.

As illustrated, the pixel unit can include a transistor 2, a pixel electrode 3, a planarization layer 4, and a pixel definition layer 5.

The transistor 2 can include a drain electrode 21, an active layer 22, a gate insulating layer 23, a gate electrode 24, an interlayer insulating layer 25, and a source electrode 26.

The pixel electrode 3 can include a first bottom conductive layer 311, a metal layer 32, and a top conductive layer 33.

The first bottom conductive layer 311 can be formed on the drain electrode 21 of the transistor 2. The first bottom conductive layer 311 can entirely cover the drain electrode 21.

The planarization layer 4 can be formed on the transistor 2 and the first bottom conductive layer 311. A via-hole can be formed in the planarization layer 4.

The metal layer 32 and the top conductive layer 33 can be successively formed on the planarization layer 4. The metal layer 32 can be electrically connected to the first bottom conductive layer 311 through the via-hole.

The gate insulating layer 23 can be formed on the active layer 22.

The gate electrode 24 can be formed on the gate insulating layer 23.

The interlayer insulating layer 25, or an interlayer dielectric layer, can be formed on the gate electrode 24. The interlayer insulating layer 25 can have two via-holes. The two via-holes also pass through the gate insulating layer 23. The active layer 22 under the gate insulating layer 23 can be exposed through the two via-holes.

The source electrode 26 and the drain electrode 21 can be respectively formed on the interlayer insulating layer 25. The source electrode 26 can be electrically connected to the active layer 22 through one of two via-holes in the interlayer insulating layer 25. The drain electrode 21 can be electrically connected to the active layer 22 through the other of the two via-holes in the insulating layer 25.

In some embodiments, the pixel electrode 3 can include three layers: the first bottom conductive layer 311, the metal layer 32, and the top conductive layer 33 covering the metal layer 32. In some other embodiments, depending on product designing and functional requirements, the pixel electrode 3 can only include two layers: the first bottom conductive layer 311 and the metal layer 32.

It should be noted that, the contact area of the first bottom conductive layer 311 and the drain electrode 21 can be increased by covering the first bottom conductive layer 311 of the pixel electrode 3 on the drain electrode 21. As such, the contact resistance can be reduced, the effective current can be enlarged, and the display device power consumption can be decreased.

Further, since the contact area between the first bottom conductive layer 311 and the drain electrode 21 is increased, an adhesion force between the first bottom conductive layer 311 and the drain electrode 21 can be enhanced. Therefore, the first bottom conductive layer 311 can be prevented being dropping off from the drain electrode 21 due to a too small contact area.

In addition, in a fabricating process of the disclosed pixel unit, the first bottom conductive layer 311 of the pixel electrode 3 can be formed before forming the planarization layer 4. And the metal layer 32 and the top conductive layer 33 of the pixel electrode 3 can be obtained by a one-stage patterning process on the planarization layer 4. Comparing to the conventional fabricating process where the first bottom conductive layer 311, the metal layer 32 and the top conductive layer 33 of the pixel electrode 3 are obtained by a one-stage patterning process after forming the planarization layer 4, the disclosed fabricating process can reduce the number of layers to be etched on the planarization layer 4.

Therefore, during the etching process, the dimensions of the metal layer 32 and the top conductive layer 33 and the etching rate can be more desirably controlled.

Figure 3:
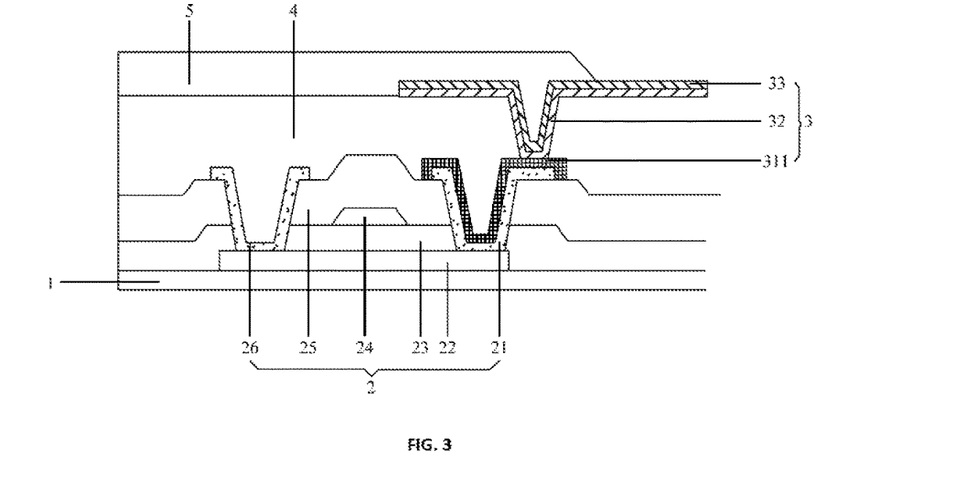
FIG. 3 illustrates a schematic cross sectional structural view of another exemplary pixel unit in accordance with some other embodiments of the present disclosure.

Referring to FIG. 3, a schematic cross sectional structural view of another exemplary pixel unit is shown in accordance with some other embodiments of the present disclosure.

As illustrated, the first bottom conductive layer 311 can cover the entire top surface and all sidewalls of the drain electrode 21. It should be noted that, FIG. 3 is a cross sectional structural view of the pixel unit, thus, only the top surface and two sidewalls of the drain electrode 21 are shown, while other sidewalls of the drain electrode 21 are not shown in FIG. 3.

In some embodiments, a material of the first bottom conductive layer 311 can be a transparent conductive material, such as Indium Tin Oxide (ITO).

In the conventional pixel units, the metal layer 32 is normally a metal silver layer. The drain electrode 21 of the transistor 2 contains metal aluminum. The planarization layer 4 is formed on the drain electrode 21, but does not cover all sidewalls of the drain electrode 21. Therefore, the sidewalls of the drain electrode 21 not covered by the planarization layer 4 are exposed to the outside. During the patterning process to etch the metal layer 32, the exposed metal aluminum of the sidewalls of the drain electrode 21 can react with the metal silver of the metal layer 32 due to the etching liquid. Therefore, the metal layer 32 can lost certain amount of metal silver, which may cause a defect of the pixel electrode 3, and may cause a defect of the drain electrode 21 in the same time, thereby resulting in a defect of the transistor 2.

In the disclosed pixel unit, the first bottom conductive layer 311 can be formed to cover an entire top surface and all sidewalls of the drain electrode 21. As such, not only the contact area between the first bottom conductive layer 311 and the drain electrode 21 can be increased, the electrochemical reaction between the metal aluminum of the drain electrode 21 and the metal silver of the metal layer 32 can be prevented. Therefore, the quality of the transistor 2 and the pixel electrode 3 can be ensured.

Figure 4:
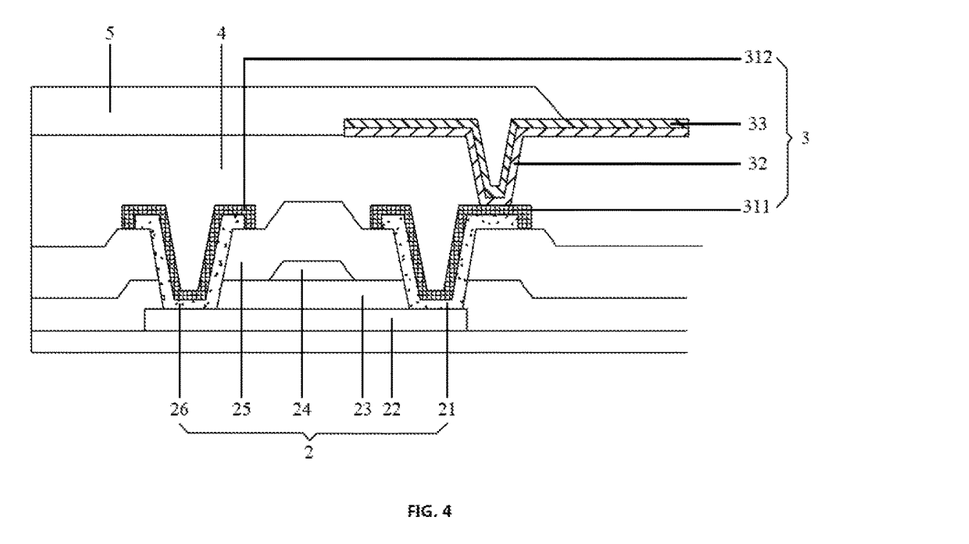
FIG. 4 illustrates a schematic cross sectional structural view of another exemplary pixel unit in accordance with some other embodiments of the present disclosure.

Referring to FIG. 4, a schematic cross sectional structural view of another exemplary pixel unit is shown in accordance with some other embodiments of the present disclosure.

As illustrated, a second conductive layer 312 can be formed between the source electrode 26 of the transistor 2 and the planarization layer 4. The second conductive layer 312 can cover the source electrode 26 of the transistor 2.

Specifically, the second bottom conductive layer 312 can cover the entire top surface and all sidewalls of the source electrode 26. It should be noted that, FIG. 4 is a cross sectional structural view of the pixel unit, thus, only the top surface and two sidewalls of the source electrode 26 are shown, while other sidewalls of the source electrode 26 are not shown.

In some embodiments, a material of the second bottom conductive layer 312 can be a transparent conductive material, such as Indium Tin Oxide (ITO).

In the conventional pixel units, a material of the source electrode 26 contains metal aluminum, which is the same material contained in the drain electrode 21. The planarization layer 4 is formed on the source electrode 26, but does not cover all sidewalls of the source electrode 26. Therefore, the sidewalls of the source electrode 26 not covered by the planarization layer 4 are exposed to the outside. During the patterning process to etch the metal layer 32, the exposed metal aluminum of the sidewalls of the source electrode 26 can react with the metal silver of the metal layer 32 due to the etching liquid. Therefore, the metal layer 32 can lost certain amount of metal silver, which may cause a defect of the pixel electrode 3, and may cause a defect of the source electrode 26 in the same time, thereby resulting in a defect of the transistor 2.

In the disclosed pixel unit, when forming the first bottom conductive layer 311, a second bottom conductive layer 312 can also be formed simultaneously between the source electrode 26 and the planarization layer 4. The second bottom conductive layer 312 can be formed to cover an entire top surface and all sidewalls of the source electrode 26. As such, not only the contact area between the second bottom conductive layer 312 and the source electrode 26 can be increased, the electrochemical reaction between the metal aluminum of the source electrode 26 and the metal silver of the metal layer 32 can be prevented. Therefore, the qualities of the transistor 2 and the pixel electrode 3 can be ensured.

In some embodiments, the second bottom conductive layer 312 can further cover a data line connected with the source electrode 26 of the transistor 2.

In the conventional fabricating process for forming pixel units, the source electrode 26 of the transistor 2 and the data line connected with the source electrode 26 can be formed simultaneously by using a patterning process. A material of the data line contains metal aluminum, which is the same material contained in the source electrode 26. However, the planarization layer 4 does not cover the data line. Therefore, the data line is exposed to the outside. During the patterning process to etch the metal layer 32, the exposed metal aluminum of the data line can react with the metal silver of the metal layer 32 due to the etching liquid. Therefore, the metal layer 32 can lost certain amount of metal silver, which may cause a defect of the pixel electrode 3, and may cause a defect of the data line in the same time, thereby resulting in a defect of the transistor 2.

In the disclosed pixel unit, the second bottom conductive layer 312 can be formed to cover an entire top surface and all sidewalls of the source electrode 26, as well as the data line connected with the source electrode 26. As such, the electrochemical reaction between the metal aluminum of the data line and the metal silver of the metal layer 32 can be prevented. Therefore, the quality of the transistor 2 and the pixel electrode 3 can be ensured.

In some embodiments, the first bottom conductive layer 311 and the second bottom conductive layer 312 can be simultaneously formed by using a one-stage patterning process. Further, a mask for forming the source electrode 26 and the drain electrode 21 of the transistor 2, as well as the data line connected with the source electrode can be used in such one-stage patterning process.

Often, the source electrode 26 and the drain electrode 21 of the transistor 2, as well as the data line connected with the source electrode can be formed through a one-stage patterning process using a single mask. In the disclosed pixel unit, the first bottom conductive layer 311 covers the drain electrode 21, and the second bottom conductive layer 312 covers the source electrode 26 and the data line connected to the source electrode. Thus, after coating a conductive layer on the source electrode 26 and the drain electrode 21 of the transistor 2, as well as an the data line connected with the source electrode, by using the same single mask for patterning the he source electrode 26 and the drain electrode 21 of the transistor 2, as well as the data line connected with the source electrode, same patterns of the source electrode 26 and the drain electrode 21 of the transistor 2, as well as the data line connected with the source electrode can be formed.

In the same time, the line width of the patterns can be controlled by adjusting the exposure process. As such, the first bottom conductive layer 311 can cover not only the entire top surface of the drain electrode 21, but also all sidewalls of the drain electrode 21. Similarly, the second bottom conductive layer 312 can cover not only the entire top surface of the source electrode 26, but also all sidewalls of the source electrode 26, and the data line connected to the source 26 as well.

Accordingly, by repeatedly using the same single mask for patterning the source electrode 26 and the drain electrode 21 of the transistor 2, as well as the data line connected with the source electrode, the cost of mask can be reduced.

In some other embodiments, the first bottom conductive layer 311 and the second bottom conductive layer 312 can be formed by using two patterning processes, which may be selected in accordance with the actual situation.

In some embodiments, a third bottom conductive layer (not shown in the figures) can be formed on a gate line connected with the gate electrode 24 of the transistor 2. The third bottom conductive layer can cover the gate line connected with the gate electrode 24 of the transistor 2. A material of the third bottom conductive layer can be a transparent conductive material, such as Indium Tin Oxide (ITO).

In the conventional fabricating process for forming pixel units, the gate electrode 24 of the transistor 2 and the gate line connected with the gate electrode 24 can be formed simultaneously by using a patterning process. A material of the gate line contains metal aluminum, which is the same material contained in the gate electrode 24. However, the planarization layer 4 does not cover the gate line. Therefore, the gate line is exposed to the outside. During the patterning process to etch the metal layer 32, the exposed metal aluminum of the gate line can react with the metal silver of the metal layer 32 due to the etching liquid. Therefore, the metal layer 32 can lost certain amount of metal silver, which may cause a defect of the pixel electrode 3, and may cause a defect of the gate line in the same time, thereby resulting in a defect of the transistor 2.

In the disclosed pixel unit, the third bottom conductive layer can be formed to cover the gate line connected with the gate electrode 24. As such, the electrochemical reaction between the metal aluminum of the gate line and the metal silver of the metal layer 32 can be prevented. Therefore, the qualities of the transistor 2 and the pixel electrode 3 can be ensured.

In some embodiments, the first bottom conductive layer 311, the second bottom conductive layer 312, and the third bottom conductive layer can be simultaneously formed by using a one-stage patterning process. In some other embodiments, the first bottom conductive layer 311, the second bottom conductive layer 312, and the third bottom conductive layer can be formed by using different patterning processes, which may be selected in accordance with the actual situation.

It should be noted that, the contact area of the first bottom conductive layer 311 and the drain electrode 21 can be increased by covering the first bottom conductive layer 311 of the pixel electrode 3 on the drain electrode 21. As such, the contact resistance can be reduced, the effective current can be enlarged, and the display device power consumption can be decreased. Since the contact area between the first bottom conductive layer 311 and the drain electrode 21 is increased, an adhesion force between the first bottom conductive layer 311 and the drain electrode 21 can be enhanced. Therefore, the first bottom conductive layer 311 can be prevented being dropping off from the drain electrode 21 due to a too small contact area.

In addition, in a fabricating process of the disclosed pixel unit, the first bottom conductive layer 311 of the pixel electrode 3 can be formed before forming the planarization layer 4. And the metal layer 32 and the top conductive layer 33 of the pixel electrode 3 can be obtained by a one-stage patterning process on the planarization layer 4. Comparing to the conventional fabricating process where the first bottom conductive layer 311, the metal layer 32 and the top conductive layer 33 of the pixel electrode 3 are obtained by a one-stage patterning process after forming the planarization layer 4, the disclosed fabricating process can reduce the number of layers to be etched on the planarization layer 4. Therefore, during the etching process, the dimensions of the metal layer 32 and the top conductive layer 33 and the etching rate can be more desirably controlled.

Further, the disclosed pixel unit can include a first bottom conductive layer 311, a second bottom conductive layer 312 and a third bottom conductive layer. The first bottom layer 311 can cover the entire top surface and all sidewalls of the drain electrode 21. The second bottom layer 312 can cover the entire top surface and all sidewalls of the source electrode 26, as well as a data line connected with the sauce electrode. The third bottom conductive layer can cover a gate line connected with the gate electrode. As such, the electrochemical reaction between the metal aluminum of the drain electrode 21, source electrode 26, data line, gate electrode 24, as well as gate line, and the metal silver of the metal layer 32 can be prevented. Therefore, the qualities of the transistor 2 and the pixel electrode 3 can be ensured.

Another aspect of the present disclosure provides an array substrate. The array substrate can include base substrate 1, and at least one pixel unit on the base substrate 1. The pixel unit can be any one of the disclosed pixel unit discussed above in connection with FIGS. 2-4.

In each pixel unit of the disclosed array substrate, the contact area of the first bottom conductive layer 311 and the drain electrode 21 can be increased by covering the first bottom conductive layer 311 of the pixel electrode 3 on the drain electrode 21. As such, the contact resistance can be reduced, the effective current can be enlarged, and the display device power consumption can be decreased. Since the contact area between the first bottom conductive layer 311 and the drain electrode 21 is increased, an adhesion force between the first bottom conductive layer 311 and the drain electrode 21 can be enhanced. Therefore, the first bottom conductive layer 311 can be prevented being dropping off from the drain electrode 21 due to a too small contact area.

In addition, in a fabricating process of the disclosed array substrate, for each pixel unit, the first bottom conductive layer 311 of the pixel electrode 3 can be formed before forming the planarization layer 4. And the metal layer 32 and the top conductive layer 33 of the pixel electrode 3 can be obtained by a one-stage patterning process on the planarization layer 4. Comparing to the conventional fabricating process where the first bottom conductive layer 311, the metal layer 32 and the top conductive layer 33 of the pixel electrode 3 are obtained by a one-stage patterning process after forming the planarization layer 4, the disclosed fabricating process can reduce the number of layers to be etched on the planarization layer 4. Therefore, during the etching process, the dimensions of the metal layer 32 and the top conductive layer 33 and the etching rate can be more desirably controlled.

Further, each pixel unit of the disclosed array substrate can include a first bottom conductive layer 311, a second bottom conductive layer 312 and a third bottom conductive layer. The first bottom layer 311 can cover the entire top surface and all sidewalls of the drain electrode 21. The second bottom layer 312 can cover the entire top surface and all sidewalls of the source electrode 26, as well as a data line connected with the sauce electrode. The third bottom conductive layer can cover a gate line connected with the gate electrode. As such, the electrochemical reaction between the metal aluminum of the drain electrode 21, source electrode 26, data line, gate electrode 24, as well as gate line, and the metal silver of the metal layer 32 can be prevented. Therefore, the qualities of the transistor 2 and the pixel electrode 3 can be ensured.

Another aspect of the present disclosure provides a display device. The display device can be an active matrix liquid crystal display device, or an active matrix organic light emitting display device. The display device can include the disclosed array substrate described above.

Specifically, the display device can be a liquid crystal panel, an electronic paper, an OLED panel, a mobile phone, a tablet computer, a television, a monitor, a laptop, a digital photo frame, a navigator, or any other product or component having a display function.

When the display device is an active matrix organic light emitting display device, as shown in FIG. 4, a pixel definition layer 5 can be formed on the pixel electrode 3 of each pixel unit. And a light emitting layer can be formed on the pixel definition layer 5. As such, the display device is able to display an image.

In each pixel unit of the disclosed display device, the contact area of the first bottom conductive layer 311 and the drain electrode 21 can be increased by covering the first bottom conductive layer 311 of the pixel electrode 3 on the drain electrode 21. As such, the contact resistance can be reduced, the effective current can be enlarged, and the display device power consumption can be decreased. Since the contact area between the first bottom conductive layer 311 and the drain electrode 21 is increased, an adhesion force between the first bottom conductive layer 311 and the drain electrode 21 can be enhanced. Therefore, the first bottom conductive layer 311 can be prevented being dropping off from the drain electrode 21 due to a too small contact area.

In addition, in a fabricating process of the disclosed display device, for each pixel unit, the first bottom conductive layer 311 of the pixel electrode 3 can be formed before forming the planarization layer 4. And the metal layer 32 and the top conductive layer 33 of the pixel electrode 3 can be obtained by a one-stage patterning process on the planarization layer 4. Comparing to the conventional fabricating process where the first bottom conductive layer 311, the metal layer 32 and the top conductive layer 33 of the pixel electrode 3 are obtained by a one-stage patterning process after forming the planarization layer 4, the disclosed fabricating process can reduce the number of layers to be etched on the planarization layer 4. Therefore, during the etching process, the dimensions of the metal layer 32 and the top conductive layer 33 and the etching rate can be more desirably controlled.

Further, each pixel unit of the disclosed display device can include a first bottom conductive layer 311, a second bottom conductive layer 312 and a third bottom conductive layer. The first bottom layer 311 can cover the entire top surface and all sidewalls of the drain electrode 21. The second bottom layer 312 can cover the entire top surface and all sidewalls of the source electrode 26, as well as a data line connected with the sauce electrode. The third bottom conductive layer can cover a gate line connected with the gate electrode. As such, the electrochemical reaction between the metal aluminum of the drain electrode 21, source electrode 26, data line, gate electrode 24, as well as gate line, and the metal silver of the metal layer 32 can be prevented. Therefore, the qualities of the transistor 2 and the pixel electrode 3 can be ensured.

Figure 5:
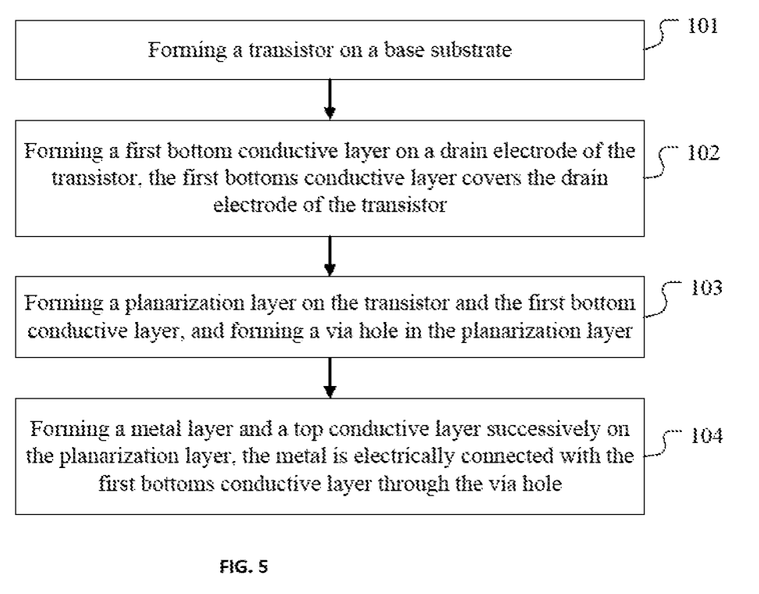
FIG. 5 illustrates a flow chart of an exemplary process for fabricating a pixel unit in accordance with some embodiments of the present disclosure.

Referring to FIG. 5, a flow chart of an exemplary process for fabricating a pixel unit is shown in accordance with some embodiments of the present disclosure.

As illustrated, the process for fabricating a pixel unit can include the following steps.

At step 101, a transistor 2 can be formed on a base substrate 1.

As shown in FIG. 2, forming the transistor 2 can include: forming an active layer 22 on the base substrate 1; forming a gate insulating layer 23 on the active layer 22; forming a gate electrode 24 on the gate insulating layer 23; forming an interlayer insulating layer 25 on the gate electrode 24; forming two via-holes in the interlayer insulating layer 25, where the two via-holes also pass through the gate insulating layer 23, and the active layer 22 under the gate insulating layer 23 can be exposed through the two via-holes; and forming a source electrode 26 and a drain electrode 21 on the interlayer insulating layer 25, where the source electrode 26 can be electrically connected to the active layer 22 through one of two via-holes in the interlayer insulating layer 25, and the drain electrode 21 can be electrically connected to the active layer 22 through the other of the two via-holes in the insulating layer 25.

At step 102, a first bottom conductive layer 311 can be formed on the drain electrode 21 of the transistor 2. The first bottom conductive layer 311 can entirely cover the drain electrode 21.

As shown in FIG. 2, the first bottom conductive layer 311 can be formed by a one-stage patterning process. Specifically, a conductive film can be formed on the transistor 2, and a photoresist film can be coated on the conductive film. The conductive film coated by the photoresist film can be exposed, developed and etched to remove the excess conductive film. The remaining photoresist film can be peeled off. As such, the first bottom conductive layer 311 can be formed on the drain electrode 21 of the transistor 2 to cover the drain electrode 21.

At step 103, a planarization layer 4 can be formed on the transistor 2 and the first bottom conductive layer 311. A via-hole can be formed in the planarization layer 4.

Specifically, a one-stage patterning process can be used to form the planarization layer 4 and the via-hole on the transistor 2 and the first bottom conductive layer 311.

At step 104, a metal layer 32 and a top conductive layer 33 can be successively formed on the planarization layer 4. The metal layer 32 can be electrically connected to the first bottom conductive layer 311 through the via-hole.

Specifically, a one-stage patterning process can be used to simultaneously form the metal layer 32 and the top conductive layer 33.

In some embodiments, the pixel electrode 3 can include three layers: the first bottom conductive layer 311, the metal layer 32, and the top conductive layer 33 covering the metal layer 32. In some other embodiments, depending on product designing and functional requirements, the pixel electrode 3 can only include two layers: the first bottom conductive layer 311 and the metal layer 32. When the pixel electrode 3 includes two layers, the step 104 can be: forming a metal layer 32 on the planarization layer 4. The metal layer 32 can be electrically connected to the first bottom conductive layer 311 through the via-hole.

It should be noted that, the contact area of the first bottom conductive layer 311 and the drain electrode 21 can be increased by covering the first bottom conductive layer 311 of the pixel electrode 3 on the drain electrode 21. As such, the contact resistance can be reduced, the effective current can be enlarged, and the display device power consumption can be decreased.

Further, since the contact area between the first bottom conductive layer 311 and the drain electrode 21 is increased, an adhesion force between the first bottom conductive layer 311 and the drain electrode 21 can be enhanced. Therefore, the first bottom conductive layer 311 can be prevented being dropping off from the drain electrode 21 due to a too small contact area.

In addition, in the disclosed process for fabricating the pixel unit, the first bottom conductive layer 311 of the pixel electrode 3 can be formed before forming the planarization layer 4. And the metal layer 32 and the top conductive layer 33 of the pixel electrode 3 can be obtained by a one-stage patterning process on the planarization layer 4. Comparing to the conventional fabricating process where the first bottom conductive layer 311, the metal layer 32 and the top conductive layer 33 of the pixel electrode 3 are obtained by a one-stage patterning process after forming the planarization layer 4, the disclosed fabricating process can reduce the number of layers to be etched on the planarization layer 4. Therefore, during the etching process, the dimensions of the metal layer 32 and the top conductive layer 33 and the etching rate can be more desirably controlled.

Further, as illustrated in FIG. 3, the first bottom conductive layer 311 formed at step 102 can cover the entire top surface and all sidewalls of the drain electrode 21. And a material of the first bottom conductive layer 311 can be a transparent conductive material, such as Indium Tin Oxide (ITO).

In the conventional pixel units, the metal layer 32 is normally a metal silver layer. The drain electrode 21 of the transistor 2 contains metal aluminum. The planarization layer 4 is formed on the drain electrode 21, but does not cover all sidewalls of the drain electrode 21. Therefore, the sidewalls of the drain electrode 21 not covered by the planarization layer 4 are exposed to the outside. During the patterning process to etch the metal layer 32, the exposed metal aluminum of the sidewalls of the drain electrode 21 can react with the metal silver of the metal layer 32 due to the etching liquid. Therefore, the metal layer 32 can lost certain amount of metal silver, which may cause a defect of the pixel electrode 3, and may cause a defect of the drain electrode 21 in the same time, thereby resulting in a defect of the transistor 2.

In the disclosed fabricating process, the first bottom conductive layer 311 can be formed to cover an entire top surface and all sidewalls of the drain electrode 21. As such, not only the contact area between the first bottom conductive layer 311 and the drain electrode 21 can be increased, the electrochemical reaction between the metal aluminum of the drain electrode 21 and the metal silver of the metal layer 32 can be prevented. Therefore, the qualities of the transistor 2 and the pixel electrode 3 can be ensured.

Figure 6:
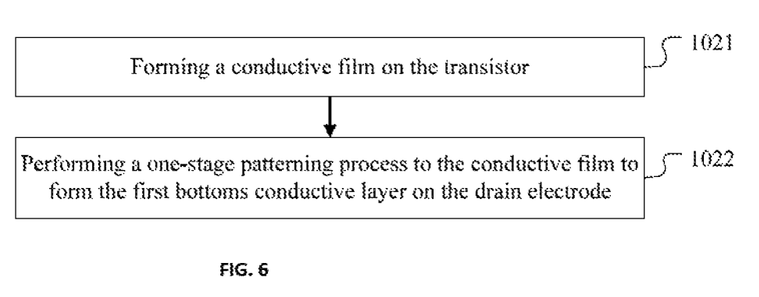
FIG. 6 illustrates a flow chart of another exemplary process for fabricating a pixel unit in accordance with some other embodiments of the present disclosure.

Referring to FIG. 6, a flow chart of another exemplary process for fabricating a pixel unit is shown in accordance with some other embodiments of the present disclosure. As illustrated, step 102 in FIG. 5 can further include the following sub-steps.

At sub-step 1021, a conductive film can be formed on the transistor 2. Specifically, the conductive film can be deposited in the transistor 2 by using any suitable deposition technique.

At sub-step 1022, by using a one-stage patterning process on the conductive film, the first bottom conductive layer can be formed on the drain electrode 21 of the transistor 2.

Figure 7:
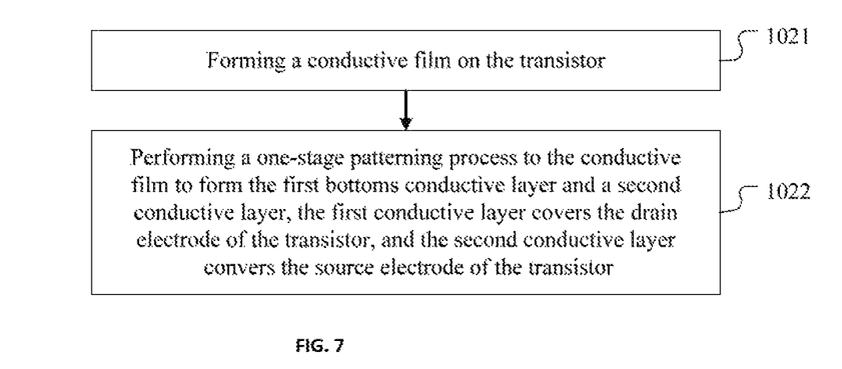
FIG. 7 illustrates a flow chart of another exemplary process for fabricating a pixel unit in accordance with some other embodiments of the present disclosure.

Referring to FIG. 7, a flow chart of another exemplary process for fabricating a pixel unit is shown in accordance with some other embodiments of the present disclosure.

As illustrated, the sub-step 1022 in FIG. 6 can further include forming a second conductive layer 312 between the source electrode 26 of the transistor 2 and the planarization layer 4. The second conductive layer 312 and the first conductive layer 311 can be formed by a one-stage patterning process. The second conductive layer 312 can cover the source electrode 26 of the transistor 2. A material of the second bottom conductive layer 312 can be a transparent conductive material, such as Indium Tin Oxide (ITO).

Specifically, a conductive film can be formed on the transistor 2, and a photoresist film can be coated on the conductive film. The conductive film coated by the photoresist film can be exposed, developed and etched to remove the excess conductive film. The remaining photoresist film can be peeled off. As such, the first bottom conductive layer 311 and the second bottom conductive layer 311 can be formed. The first bottom conductive layer 311 can cover the entire top surface and all sidewalls of the drain electrode 21. The second bottom conductive layer 312 can cover the entire top surface and all sidewalls of the source electrode 26.

In some other embodiments, the first bottom conductive layer 311 and the second bottom conductive layer 312 can be formed by musing two patterning processes, which may be selected in accordance with the actual situation.

In the conventional pixel units, a material of the source electrode 26 contains metal aluminum, which is the same material contained in the drain electrode 21. The planarization layer 4 is formed on the source electrode 26, but does not cover all sidewalls of the source electrode 26. Therefore, the sidewalls of the source electrode 26 not covered by the planarization layer 4 are exposed to the outside. During the patterning process to etch the metal layer 32, the exposed metal aluminum of the sidewalls of the source electrode 26 can react with the metal silver of the metal layer 32 due to the etching liquid. Therefore, the metal layer 32 can lost certain amount of metal silver, which may cause a defect of the pixel electrode 3, and may cause a defect of the source electrode 26 in the same time, thereby resulting in a defect of the transistor 2.

In the disclosed fabricating process, the second bottom conductive layer 312 can be formed to cover the entire top surface and all sidewalls of the source electrode 26. As such, not only the contact area between the second bottom conductive layer 312 and the source electrode 26 can be increased, the electrochemical reaction between the metal aluminum of the source electrode 26 and the metal silver of the metal layer 32 can be prevented. Therefore, the qualities of the transistor 2 and the pixel electrode 3 can be ensured.

In some embodiments, the second bottom conductive layer 312 can be formed to cover a data line connected with the source electrode 26 of the transistor 2.

Specifically, a conductive film can be formed on the source electrode 26, the drain electrode 21, and the data line connected with the source electrode 26. Then, a mask for forming the source electrode 26 and the drain electrode 21 of the transistor 2, as well as the data line connected with the source electrode can be used again in a one-stage patterning process to form the first bottom conductive layer 311 and the second bottom conductive layer 311 simultaneously. In the same time, the line width of the patterns can be controlled by adjusting the exposure process. As such, the first bottom conductive layer 311 can cover not only the entire top surface of the drain electrode 21, but also all sidewalls of the drain electrode 21. Similarly, the second bottom conductive layer 312 can cover not only the entire top surface of the source electrode 26, but also all sidewalls of the source electrode 26, and the data line connected to the source 26 as well.

In the conventional fabricating process for forming pixel units, the source electrode 26 of the transistor 2 and the data line connected with the source electrode 26 can be formed simultaneously by using a patterning process. A material of the data line contains metal aluminum, which is the same material contained in the source electrode 26. However, the planarization layer 4 does not cover the data line. Therefore, the data line is exposed to the outside. During the patterning process to etch the metal layer 32, the exposed metal aluminum of the data line can react with the metal silver of the metal layer 32 due to the etching liquid. Therefore, the metal layer 32 can lost certain amount of metal silver, which may cause a defect of the pixel electrode 3, and may cause a defect of the data line in the same time, thereby resulting in a defect of the transistor 2.

In the disclosed pixel unit, the second bottom conductive layer 312 can be formed to cover an entire top surface and all sidewalls of the source electrode 26, as well as the data line connected with the source electrode 26. As such, the electrochemical reaction between the metal aluminum of the data line and the metal silver of the metal layer 32 can be prevented. Therefore, the quality of the transistor 2 and the pixel electrode 3 can be ensured. Further, by repeatedly using the same single mask for patterning the he source electrode 26 and the drain electrode 21 of the transistor 2, as well as the data line connected with the source electrode, the cost of mask can be reduced.

Figure 8:
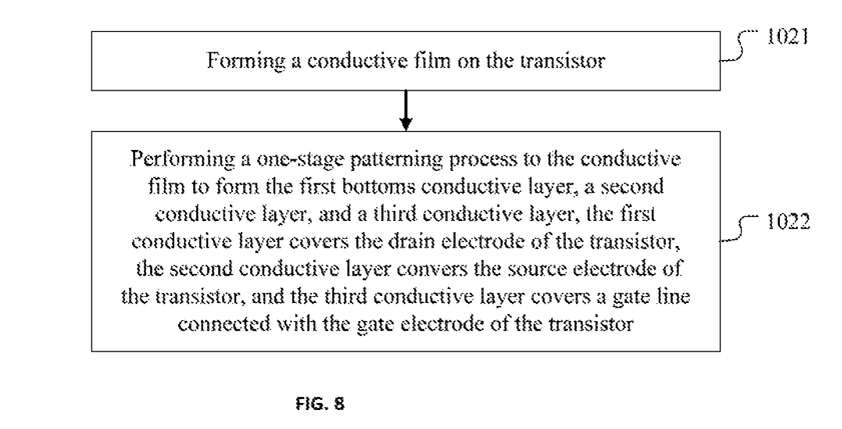
FIG. 8 illustrates a flow chart of another exemplary process for fabricating a pixel unit in accordance with some other embodiments of the present disclosure.

Referring to FIG. 8, a flow chart of another exemplary process for fabricating a pixel unit is shown in accordance with some other embodiments of the present disclosure. As illustrated, the step 1022 in FIG. 6 can further include: forming a third bottom conductive layer (not shown in the figures). In some embodiments, the first bottom conductive layer 311, the second bottom conductive layer 312, and the third bottom conductive layer can be simultaneously formed by using a one-stage patterning process. The third bottom conductive layer can cover the gate line connected with the gate electrode 24 of the transistor 2. A material of the third bottom conductive layer can be a transparent conductive material, such as Indium Tin Oxide (ITO).

Specifically, a conductive film can be formed on the transistor 2, and a photoresist film can be coated on the conductive film. The conductive film coated by the photoresist film can be exposed, developed and etched to remove the excess conductive film. The remaining photoresist film can be peeled off. As such, the first bottom conductive layer 311, the second bottom conductive layer 311, and the third bottom conductive layer can be formed. In some other embodiments, the first bottom conductive layer 311, the second bottom conductive layer 312, and the third bottom conductive layer can be formed by using different patterning processes, which may be selected in accordance with the actual situation.

In the conventional fabricating process for forming pixel units, the gate electrode 24 of the transistor 2 and the gate line connected with the gate electrode 24 can be formed simultaneously by using a patterning process. A material of the gate line contains metal aluminum, which is the same material contained in the gate electrode 24. However, the planarization layer 4 does not cover the gate line. Therefore, the gate line is exposed to the outside. During the patterning process to etch the metal layer 32, the exposed metal aluminum of the gate line can react with the metal silver of the metal layer 32 due to the etching liquid. Therefore, the metal layer 32 can lost certain amount of metal silver, which may cause a defect of the pixel electrode 3, and may cause a defect of the gate line in the same time, thereby resulting in a defect of the transistor 2.

In the disclosed fabricating process, the third bottom conductive layer can be formed to cover the gate line connected with the gate electrode 24. As such, the electrochemical reaction between the metal aluminum of the gate line and the metal silver of the metal layer 32 can be prevented. Therefore, the qualities of the transistor 2 and the pixel electrode 3 can be ensured.

It should be noted that, the contact area of the first bottom conductive layer 311 and the drain electrode 21 can be increased by covering the first bottom conductive layer 311 of the pixel electrode 3 on the drain electrode 21. As such, the contact resistance can be reduced, the effective current can be enlarged, and the display device power consumption can be decreased. Since the contact area between the first bottom conductive layer 311 and the drain electrode 21 is increased, an adhesion force between the first bottom conductive layer 311 and the drain electrode 21 can be enhanced. Therefore, the first bottom conductive layer 311 can be prevented being dropping off from the drain electrode 21 due to a too small contact area.

In addition, in a fabricating process of the disclosed pixel unit, the first bottom conductive layer 311 of the pixel electrode 3 can be formed before farming the planarization layer 4. And the metal layer 32 and the top conductive layer 33 of the pixel electrode 3 can be obtained by a one-stage patterning process on the planarization layer 4. Comparing to the conventional fabricating process where the first bottom conductive layer 311, the metal layer 32 and the top conductive layer 33 of the pixel electrode 3 are obtained by a one-stage patterning process after forming the planarization layer 4, the disclosed fabricating process can reduce the number of layers to be etched on the planarization layer 4. Therefore, during the etching process, the dimensions of the metal layer 32 and the top conductive layer 33 and the etching rate can be more desirably controlled.

Further, the disclosed pixel unit can include a first bottom conductive layer 311, a second bottom conductive layer 312 and a third bottom conductive layer. The first bottom layer 311 can cover the entire top surface and all sidewalls of the drain electrode 21. The second bottom layer 312 can cover the entire top surface and all sidewalls of the source electrode 26, as well as a data line connected with the sauce electrode. The third bottom conductive layer can cover a gate line connected with the gate electrode. As such, the electrochemical reaction between the metal aluminum of the drain electrode 21, source electrode 26, data line, gate electrode 24, as well as gate line, and the metal silver of the metal layer 32 can be prevented. Therefore, the quality of the transistor 2 and the pixel electrode 3 can be ensured.

It should be noted that, the above steps of the flow diagrams of FIGS. 5-8 can be executed or performed in any order or sequence not limited to the order and sequence shown and described in the present drawings. Also, some of the above steps of the flow diagrams of FIGS. 5-8 can be executed or per substantially simultaneously where appropriate or in parallel to reduce latency and processing times. Furthermore, it should be noted that FIGS. 5-8 are provided as an example only. At least some of the steps shown in the figures may be performed in a different order than represented, performed concurrently, or altogether omitted.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a pixel unit, an array substrate, and a display device, and their fabrication methods are provided.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure, which is only limited by the claims which follow. Features of the disclosed embodiments can be combined and rearranged in various ways. Without departing from the spirit and scope of the present disclosure, modifications, equivalents, or improvements to the present disclosure are understandable to those skilled in the art and are intended to be encompassed within the scope of the present disclosure.

What is claimed is:

1. A pixel unit, comprising:
a transistor, including a drain electrode;
a pixel electrode, including a first bottom conductive layer in contact with a surface of the drain electrode and a metal layer; and
a planarization layer, formed on the transistor and the first bottom conductive layer;
wherein the metal layer is electrically connected to the first bottom conductive layer through a via-hole in the planarization layers;
the first bottom conductive layer is spaced apart from an active layer of the transistor by the drain electrode;
the first bottom conductive layer is in direct contact with the metal layer;
the metal layer is spaced part from the drain electrode by the first bottom conductive layer; and
an orthographic projection of the first bottom conductive layer on the planarization layer covers an orthographic projection of the drain electrode on the planarization layer.

2. The pixel unit of claim 1, wherein:
the first bottom conductive layer covers an entire surface of the drain electrode.

3. The pixel unit of claim 2, wherein:
the first bottom conductive layer further covers one or more sidewalls of the drain electrode.

4. The pixel unit of claim 1, further comprising:
a second bottom conductive layer formed on a source electrode of the transistor, wherein the second bottom conductive layer covers an entire surface and one or more sidewalls of the source electrode.

5. The pixel unit of claim 4, wherein:
the second bottom conductive layer further covers data lines connected with the source electrode.

6. The pixel unit of claim 1, further comprising:
a third bottom conductive layer formed to cover a gate line connected with the gate electrode of the transistor, the third bottom conductive layer and the first bottom conductive layer being in a same layer and comprise a same material.

7. The pixel unit of claim 1, wherein the metal layer is metallic silver layer.

8. The pixel unit of claim 1, wherein the pixel electrode further includes:
a top conductive layer formed on the metal layer, wherein the top conductive layer covers the metal layer.

9. An array substrate, comprising:
a base substrate; and
at least one pixel unit of claim 1 on the base substrate.

10. A display device, comprising an array substrate of claim 9.

11. A method for fabricating a pixel unit, comprising:
forming a transistor including a drain electrode;
forming a first bottom conductive layer in contact with a surface of the drain electrode to cover the drain electrode;
forming a planarization layer on the transistor and the first bottom conductive layer;
forming a via-hole in the planarization layer to expose the first bottom conductive layer; and
forming a metal layer on the planarization layer and electrically connected with the first bottom conductive layer through the via-hole;
wherein the first bottom conductive layer is formed to be spaced apart from an active layer of the transistor by the drain electrode;
the first bottom conductive layer is formed to be in direct contact with the metal layer;
the metal layer is formed to be spaced part from the drain electrode by the first bottom conductive layer; and
an orthographic projection of the first bottom conductive layer on the planarization layer covers an orthographic projection of the drain electrode on the planarization layer.

12. The method of claim 11, wherein:
the first bottom conductive layer is formed to cover an entire surface and one or more sidewalls of the drain electrode.

13. The method of claim 11, wherein forming the first bottom conductive layer includes:
forming a conductive film on the transistor; and
patterning the conductive film to form the first bottom conductive layer on the drain electrode.

14. The method of claim 13, further comprising:
forming a second bottom conductive layer on a source electrode of the transistor to cover the source electrode.

15. The method of claim 14, wherein:
the second bottom conductive layer is formed simultaneously with the first bottom conductive layer during a one-stage patterning process.

16. The method of claim 13, wherein:
the second bottom conductive layer is formed to cover an entire top surface and all sidewalls of the source electrode.

17. The method of claim 16, wherein:
the second bottom conductive layer is formed to further cover a data line connected with the source electrode.

18. The method of claim 13, further comprising:
forming a third bottom conductive layer on a gate line connected with the gate electrode of the transistor to cover the gate line, the third bottom conductive layer and the first bottom conductive layer being formed in a same layer and made of a same material.

19. The method of claim 18, wherein:
the third bottom conductive layer is formed simultaneously with the first bottom conductive layer during the patterning process.

20. The method of claim 11, further comprising:
forming a top conductive layer on the metal layer to cover the metal layer.

* * * * *